(12) United States Patent
Chinda

(10) Patent No.: US 6,969,910 B2
(45) Date of Patent: Nov. 29, 2005

(54) SEMICONDUCTOR DEVICE, WIRING BOARD AND METHOD OF MAKING SAME

(75) Inventor: Akira Chinda, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 83 days.

(21) Appl. No.: 10/655,587

(22) Filed: Sep. 5, 2003

(65) Prior Publication Data
US 2004/0104487 A1 Jun. 3, 2004

(30) Foreign Application Priority Data
Sep. 6, 2002 (JP) .............................. 2002-261334
Apr. 9, 2003 (JP) .............................. 2003-105374

(51) Int. Cl.$^7$ ......................... H01L 23/48; H01L 23/52
(52) U.S. Cl. ..................................... 257/738; 257/734
(58) Field of Search ............................. 257/738, 762, 257/734

(56) References Cited

U.S. PATENT DOCUMENTS

2004/0004285 A1 * 1/2004 Cheng et al. ............... 257/737

FOREIGN PATENT DOCUMENTS

| JP | 10-041356 A | 2/1998 |
| JP | 2001-203241 A | 7/2001 |
| JP | 2003-152032 A | 5/2003 |

OTHER PUBLICATIONS

T. Takemoto et al., "High Reliability Micro-Soldering", Kogyochosakai, 1991, p. 115.

* cited by examiner

Primary Examiner—Michael Trinh
Assistant Examiner—Kiesha Rose
(74) Attorney, Agent, or Firm—Foley & Lardner LLP

(57) ABSTRACT

A semiconductor device has: a wiring board that includes an insulating substrate and a wiring provided on the insulating substrate; a semiconductor chip that is mounted on the wiring board; an opening that is formed at a predetermined position in the insulating substrate, one end of the opening being shut by the wiring to form the bottom of the opening; a thin film conductor that is formed on the surface of the wiring and at the bottom of the opening; an embedded conductor layer that is provided in the opening while contacting the thin film conductor formed at the bottom of the opening; and an external connection terminal that is disposed at the other end of the opening to electrically connect with the wiring through the embedded conductor layer and the thin film conductor provided in the opening. The thin film conductor includes gold plating layer formed on the surface, the external connection terminal is of tin or an alloy including tin, and the embedded conductor layer is of a conductor that has a rate of solution to tin or an alloy including tin lower than that of gold.

9 Claims, 16 Drawing Sheets

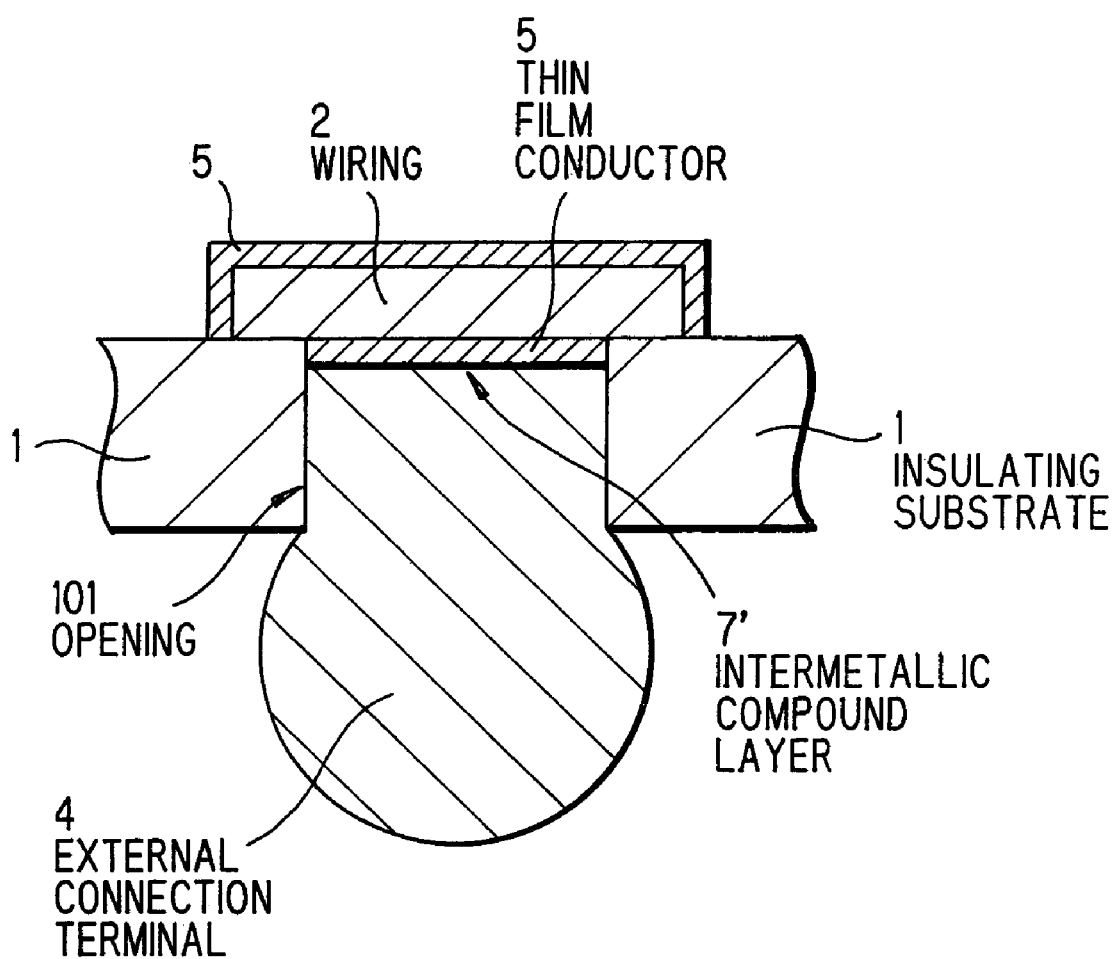

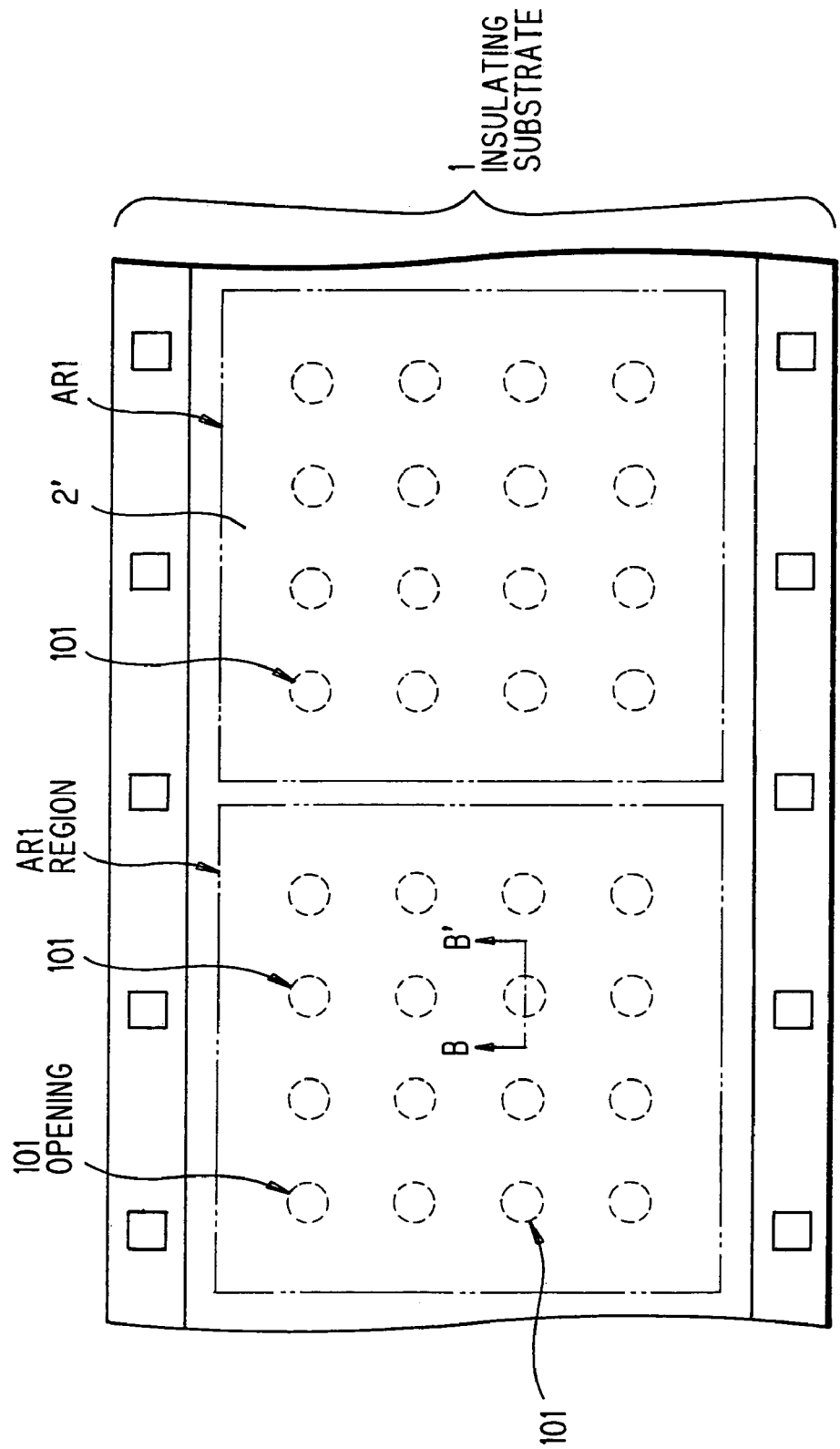

SEMICONDUCTOR DEVICE, WIRING BOARD AND METHOD OF MAKING SAME

The present application is based on Japanese patent application Nos.2002-261334 and 2003-105374, the entire contents of which are incorporated herein by reference.

BACKGROUND OF THE INVENTION

1. Field of the Invention

This invention relates to a semiconductor device, a wiring board and a method of making the wiring board and, in particular, to a semiconductor device such as BGA (Ball Grid Array) or CSP (Chip Size/Scale Package) that uses external connection terminals of tin-zinc alloy etc.

2. Description of the Related Art

Conventionally, semiconductor devices called BGA or CSP are structured such that a semiconductor chip is mounted on a wiring board composed of an insulating substrate with wirings formed thereon.

For example, in a BOA type semiconductor device, as shown in FIGS. 1A and 1B, a semiconductor chip 3 is mounted through adhesive 8 on a wiring board composed of an insulating substrate 1 and wirings 2 formed thereon. The wirings 2 of wiring board are electrically connected through bonding wires 9 with external electrodes 301 of the semiconductor chip 3.

Also, as shown in FIGS. 1B and 2, the insulating substrate 1 of wiring board is provided with openings 101 for placing external connection terminals 4, and part of wiring 2 is disposed shutting one end of the opening 101. The external connection terminal 4 is electrically connected with the wiring 2 in the opening 101.

Also, as shown in FIG. 2, thin film conductor 5 is provided on the surface of wiring 2 and at the bottom of opening 101. In case of BGA type semiconductor device shown in FIGS. 1A and 1B, the thin film conductor 5 is frequently of gold plating or gold plating with nickel plating base layer so as to give a good connectivity with bonding wire 9.

As shown in FIG. 2, the thin film conductor 5 is frequently disposed at the bottom of opening 101. Thus, the wiring 2 is electrically connected through the thin film conductor 5 (gold plating) with the external connection terminal 4. The external connection terminal 4 is of an alloy including gold, e.g. tin-zinc alloy. Thereby, intermetallic compound layer 7 between gold and tin-zinc alloy is generated at the interface of external connection terminal 4 and thin film conductor 5.

A method of making the wiring board used for the semiconductor device will be described below. First, as shown in FIG. 3A, conductor film 2' of copper foil is sticked onto the insulating substrate 1 in which openings 101 are formed by punching with a metal mold (punching mold). Alternatively, after the conductor film 2' is sticked to the insulating substrate 1, openings 101 nay be formed in the insulating substrate 1 by radiating laser light such as carbon dioxide layer.

Next, the conductor film 2' is etched to form wirings 2 as shown in FIG. 3B. The wirings 2 are formed by using the additive method or subtractive method.

Then, as shown in FIG. 3C, thin film conductor 5 of gold plating with nickel plating base layer is formed on the surface of wiring 2 and at the bottom of opening 101.

A method of making the semiconductor device using the wiring board thus obtained will be described below. As shown in FIG. 1B, the semiconductor chip 3 is sticked through adhesive 8 onto the wiring board. After the external electrode 301 of semiconductor chip 3 is electrically connected through bonding wire 9 with the wiring 2 of wiring board, the semiconductor chip 3 and the peripherals are sealed with insulation 10. Then, the external connection terminal 4 is placed at the opening 101 disposed in the insulating substrate 1.

In forming the external connection terminal 4, generally, as shown in FIG. 4, solder ball 4' of tin-zinc alloy is at opening 101 in the insulating substrate 1 and then is ref lowed by heating. At that time, the solder melted flows into the opening 101, contacting thin film conductor 5 (gold plating) provided at the bottom of the opening 101. Thereby, as shown in FIG. 2, intermetallic compound layer 7' between gold and tin-zinc alloy is formed to connect (join) the external connection terminal 4.

In recent years, due to the miniaturization and high-density arrangement of external connection terminal 4 formed in semiconductor device, the aspect ratio of opening 101, i.e., a ratio of depth and diameter of opening 101 is increasing. Therefore, there is a problem that a defective connection is likely to occur between external connection terminal 4 and thin film conductor 5 (wiring 2) since the distance from solder ball 4' on the opening 101 to thin film conductor 5 at the bottom of the opening 101 is increased.

On the other hand, when the aspect ratio of opening 101 is increased, the amount of solder flown into the opening 101 in reflowing the solder ball 4' increases. Therefore, there is also a problem that the external connection terminal 4 is likely to have a defective shape.

In order to prevent such problems as defective connection between external connection terminal 4 and thin film conductor 5 (wiring 2) and defective shape in external connection terminal 4, as shown in FIG. 5, embedded conductor layer 6, is formed in opening 101 by copper chemical gilding and then thin film conductor 5 is formed thereon (See, for example, Japanese patent application laid-open No.10-41356).

In the wiring board that embedded conductor layer 6' is formed in opening 101, the depth of opening 101 is reduced by the thickness of embedded conductor layer 6 and the aspect ratio of opening 101 is reduced by that much. Therefore, in forming the external connection terminal 4, as shown in FIG. GA, the distance of solder ball 4' and thin film conductor 5 is shortened. Also, by controlling the thickness of embedded conductor layer 6', as shown in FIG. 6, solder ball 4' can be in contact with thin film conductor 5. Accordingly, when reflowing the solder ball 4', the defective connection between external connection terminal 4 and thin film conductor 5 and defective shape in external connection terminal 4 can be prevented.

However, in the conventional semiconductor devices, there is a problem caused by intermetallic compound layer 7' generated at the interface of external connection terminal 4 and thin film conductor 5. The external connection terminal 4 is connected with wiring 2 through the intermetallic compound layer 7' to be formed between external connection terminal 4 and thin film conductor 5 formed at the bottom of opening 101. Just after the external connection terminal 4 was formed, the intermetallic compound layer 7, of gold and tin-zinc alloy has a very thin thickness, as shown in FIG. 7A or 7B. However, when the semiconductor device is used as electronic parts (module) while being mounted on a mounting board, the intermetallic compound layer 7, as shown in FIG. 8A or 8B, grows and becomes thick since the interdiffusion between gold in thin film conductor 5 and tin-zinc alloy in external connection terminal 4 is promoted by a temperature rise in using the semiconductor device.

The intermetallic compound layer 7' of gold and tin-zinc alloy is mechanically fragile. According as the thickness of intermetallic compound layer 7' increases, as shown in FIG. 9A, cracks (CK) are likely to occur in the intermetallic compound layer 7' due to thermal stress or mechanical stress in using the semiconductor device.

Further, if the semiconductor device is continuously used while having cracks in the intermetallic compound layer 7', as shown in FIG. 9B, the intermetallic compound layer 7' may be subject to breaking and the external connection terminal 4 may fall off the opening 101, i.e., the semiconductor device.

In order to prevent the falling-off of external connection terminal 4 caused by the growth of intermetallic compound layer 7', a method is suggested that the opening 101 is masked using a masking tape so as not to form the thin film conductor 5 (gold plating) at the bottom of opening 101 (See Japanese patent application laid-open No. 2003-152032).

However, there is a problem that the steps of sticking the masking tape onto the wiring board before making the thin film conductor 5 and peeling it later are required. Therefore, the manufacturing cost of wiring board has to be increased by that much.

SUMMARY OF THE INVENTION

It is an object of the invention to provide a semiconductor device that external connection terminals can be prevented from falling off.

It is another object of the invention to provide a semiconductor device that a defective connection and shape in external connection terminal can be prevented.

It is a further object of the invention to provide a wiring board that external connection terminals can be prevented from falling off while suppressing an increase in manufacturing cost.

It is a further object of the invention to provide a method of making a wiring board that external connection terminals can be prevented from falling off while suppressing an increase in manufacturing cost.

According to one aspect of the invention, a semiconductor device, comprises;

a wiring board that includes an insulating substrate and a wiring provided on the insulating substrate;

a semiconductor chip that is mounted on the wiring board;

an opening that is formed at a predetermined position in the insulating substrate, one end of the opening being shut by the wiring to form the bottom of the opening;

a thin film conductor that is formed on the surface of the wiring and at the bottom of the opening;

an embedded conductor layer that is provided in the opening while contacting the thin film conductor formed at the bottom of the opening; and an external connection terminal that is disposed at the other end of the opening to electrically connect with the wiring through the embedded conductor layer and the thin film conductor provided in the opening;

wherein the thin film conductor includes gold plating layer formed on the surface, the external connection terminal is of tin or an alloy including tin, and the embedded conductor layer is of a conductor that has a rate of solution to tin or an alloy including tin lower than that of gold.

According to another aspect of the invention, a wiring board comprises:

an insulating substrate a wiring provided on the insulating substrate;

an opening that is formed at a predetermined position in the insulating substrate, one end of the opening being shut by the wiring to form the bottom of the opening;

a thin film conductor that is formed on the surface of the wiring and at the bottom of the opening; and an embedded conductor layer that is provided in the opening while contacting the thin film conductor formed at the bottom of the opening;

wherein the thin film conductor includes gold plating layer formed on the surface, and the embedded conductor layer is of a conductor that has a rate of solution to tin or an alloy including tin lower than that of gold.

According to another aspect of the invention, a method of making a wiring board, comprises the steps of:

forming an opening at a predetermined position in an insulating substrate;

forming a wiring pattern on the surface of the insulating substrate such that one end of the opening is shut by the wiring pattern to form the bottom of the opening;

forming a thin film conductor on the surface of the wiring and at the bottom of the opening; and forming an embedded conductor layer in the opening such that the embedded conductor layer contacts the thin film conductor formed at the bottom of the opening;

wherein the thin film conductor includes gold plating layer formed on the surface, and the embedded conductor layer is of a conductor that has a rate of solution to tin or an alloy including tin lower than that of gold.

In the invention, the growth rate of intermetallic compound layer formed between embedded conductor layer and external connection terminal is smaller than that of the conventional intermetallic compound layer that is formed between thin film conductor (gold plating) and external connection terminal (tin-zinc alloy). Thus, the intermetallic compound layer, which is mechanically fragile, is less likely to thicken and therefore cracks are less likely to occur therein. Accordingly, as compared to the conventional semiconductor devices, the intermetallic compound layer in semiconductor device of the invention is less subject to breaking and therefore the external connection terminal can be prevented from failing off the wiring board.

The embedded conductor layer can be of copper, nickel, palladium, silver, platinum etc.

Also, the embedded conductor layer (copper plating) preferably has a thickness of 20 $\mu$m or more. Thereby, the embedded conductor layer can prevent fragile intermetallic compound layer from being formed by interdiffusion between gold in thin film conductor and tin in external connection terminal at the interface of embedded conductor layer and external connection terminal. Therefore, the connectivity reliability of solder ball can be kept for a long period.

BRIEF DESCRIPTION OF THE DRAWINGS

The preferred embodiments according to the invention will be explained below referring to the drawings, wherein:

FIG. 2 is an enlarged cross sectional view showing the peripherals of external connection terminal 4 in FIG. 1B;

FIG. 12 is a plain view illustrating the method of making a wiring board used for the semiconductor device in the embodiment according to the invention;

DETAILED DESCRIPTION OF THE PREFERRED EMBODIMENTS

Figure 10A:
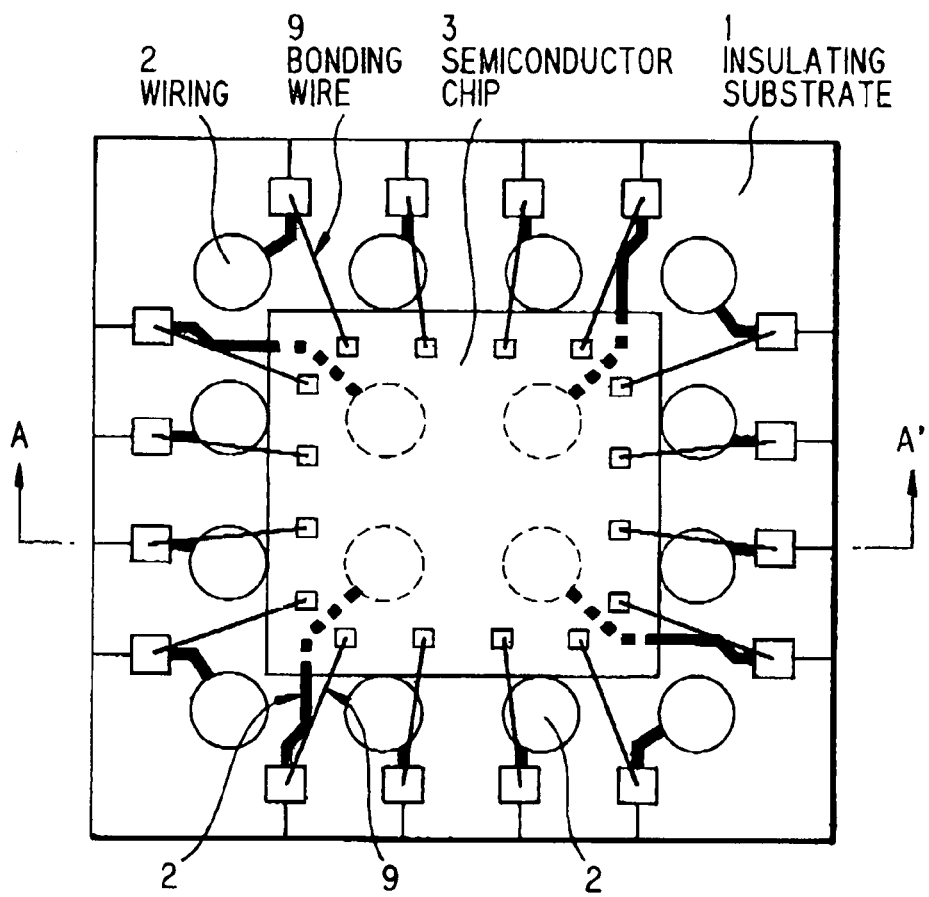
FIG. 10A is a plain view schematically showing a semiconductor device in a preferred embodiment according to the invention.
Figure 10B:
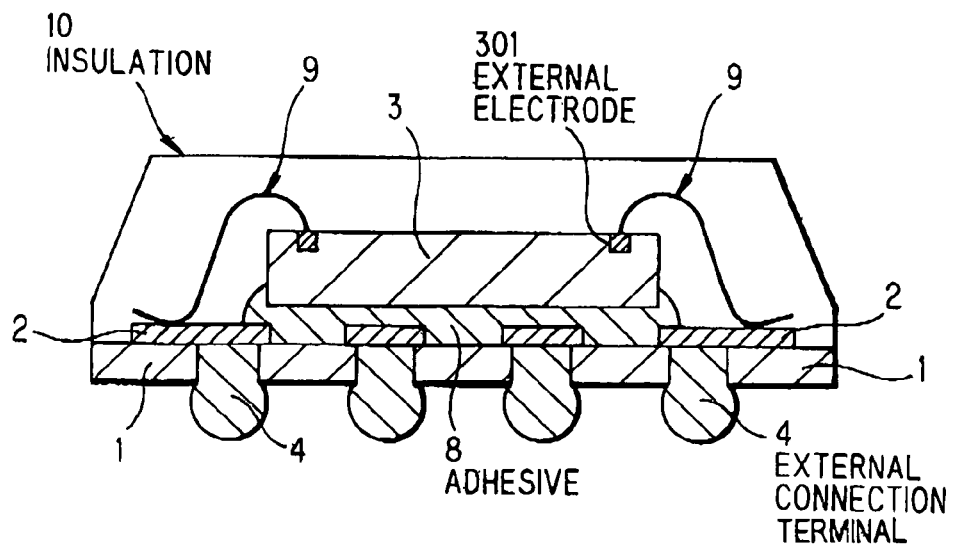
FIG. 10B is a cross sectional view cut along the line A–A' in FIG. 10B.
Figure 11:
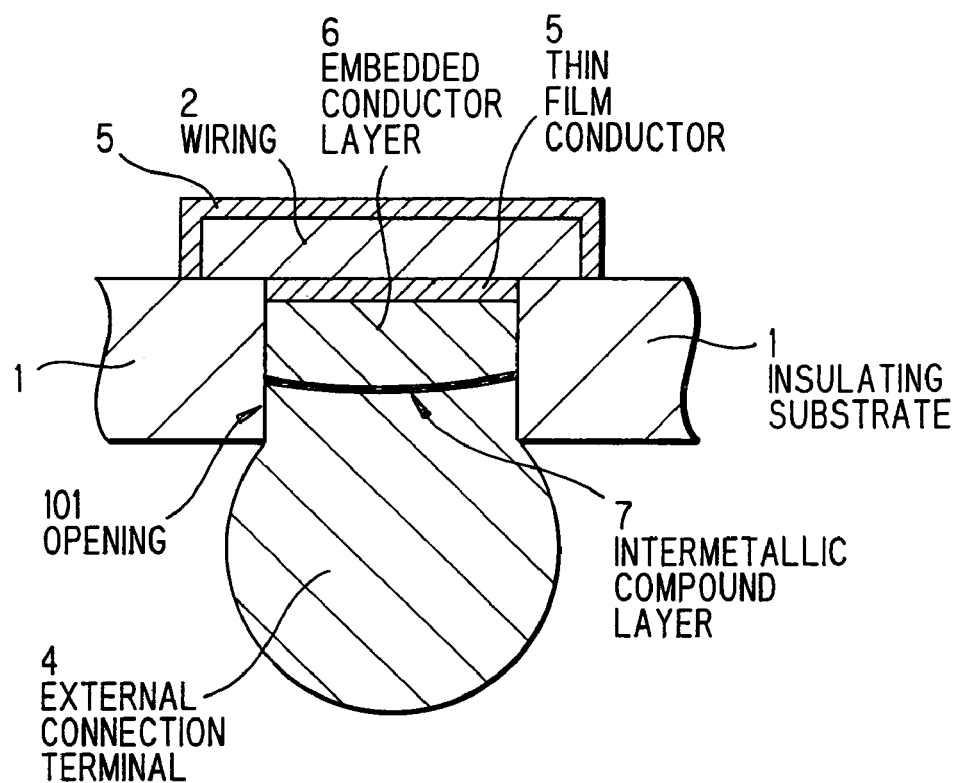
FIG. 11 is an enlarged cross sectional view showing the peripherals of external connection terminal 4 in FIG. 10B.

FIG. 10A is a plain view showing a schematic semiconductor device in a preferred embodiment according to the invention. FIG. 10B is a cross sectional view cut along the line A–A' in FIG. 10A. FIG. 11 is an enlarged cross sectional view showing the vicinity of an external connection terminal 4 in FIG. 10B.

In FIGS. 10A, 10B and FIG. 11, 1 is an insulating substrate, 2 is a wiring, 3 is a semiconductor chip, 301 is an external electrode of the semiconductor chip 3, 4 is the external connection terminal 4 (tin-zinc alloy). 5 is a thin film conductor (gold plating), 6 is an embedded conductor layer (copper plating), 7 is an intermetallic compound layer of copper and tin-zinc alloy, 8 is adhesive, 9 is a bonding wire and 10 is an insulation (sealing material).

As shown in FIGS. 10A, 10B, the semiconductor device of the embodiment is composed of a wiring board that includes the insulating substrate 1 with the wiring (conductor pattern) 2 formed thereon, the semiconductor chip 3 mounted on the wiring board, and the external connection terminal 4 that is electrically connected with the wiring 2 on the wiring board the external connection terminal 4 may be of tin or an alloy including tin and is of tin-zinc alloy in this embodiment.

The wiring board has openings 101 formed at predetermined positions in the insulating substrate 1 and part of the wiring 2 shuts one end of the opening 101 in the insulating substrate 1. Thereby, the wiring 2 is electrically connected with the external connection terminal 4 in the opening 101 of the insulating substrate 1.

As shown in FIG. 11, the thin film conductor 5 is provided on the surface of the wiring 2 and at the bottom of the opening 101 in the insulating substrate 1. The thin film conductor 5 is of gold plating or gold plating with nickel plating base layer.

Also, as shown in FIG. 11, the wiring board of the embodiment has the embedded conductor layer 6 that is provided between the external connection terminal 4 and thin film conductor 5. The external connection terminal 4 and the embedded conductor layer 6 are joined through the intermetallic compound layer 7 that is made from the conductive element of embedded conductor layer 6 and tin-zinc alloy of the external connection terminal 4.

The embedded conductor layer 6 is of a conductive element that has a rate of solution to tin or tin-containing alloy lower than that of gold. In this embodiment, the embedded conductor layer 6 is of copper. Thus, the intermetallic compound layer 7 is made from copper and tin-zinc alloy.

The semiconductor chip 3 is, as shown in FIGS. 10A and 10B, sticked onto the wiring board by adhesive 8. The external electrode 301 of the semiconductor chip 3 is electrically connected through the bonding wire 9 to the wiring 2 of the wiring board. The semiconductor chip 3 and the peripherals are sealed with insulation 10.

In this embodiment, as shown in FIG. 11, the embedded conductor layer 6 of copper is provided between the thin film conductor 5 (gold plating layer) and the external connection terminal 4, and the external connection terminal 4 (tin-zinc alloy) is joined with the embedded conductor layer 6 (copper) through the intermetallic compound layer 7 formed therebetween. The embedded conductor layer 6 (copper) has a rate of solution to the external connection terminal 4 (tin-zinc alloy) single digit or double digits lower than that of gold (See Tadashi Takemoto and Ryohei Satoh, "High Reliability Micro-soldering", p. 115, 1991, Kogyochosakai).

In other words, when the semiconductor device of the embodiment is exactly used as electronic parts while being mounted on a mounting board, the growth rate of intermetallic compound layer 7 is smaller than that of the conventional intermetallic compound layer 7' that is made from gold and tin-zinc alloy. Thus, the intermetallic compound layer 7, mechanically fragile, of the embodiment is less likely to thicken and therefore cracks are less likely to occur therein. Accordingly, as compared to the conventional semiconductor devices, the intermetallic compound layer 7 of the embodiment is less subject to breaking and therefore the external connection terminal 4 can be prevented from falling off the wiring board.

The method of making a wiring board used for a semiconductor device in the embodiment will be explained referring to FIGS. 12 to 15C.

Figure 13:
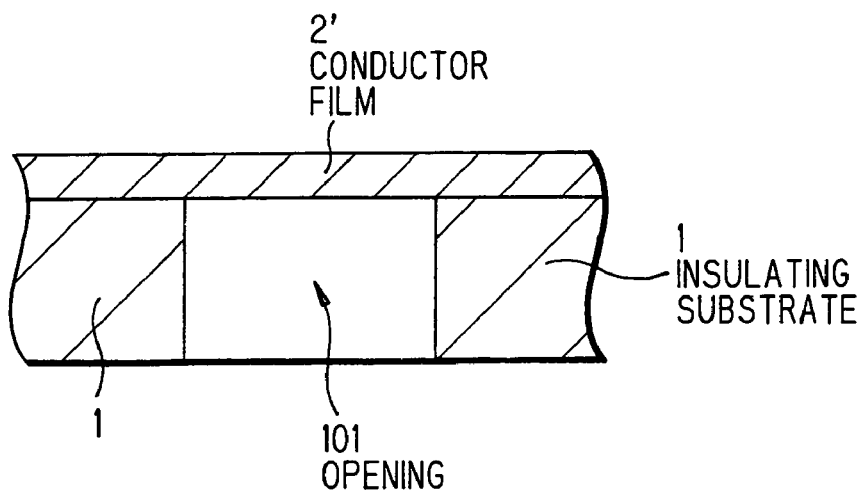
FIG. 13 is a cross sectional view cut along the line B–B' in FIG. 12.
Figure 14:
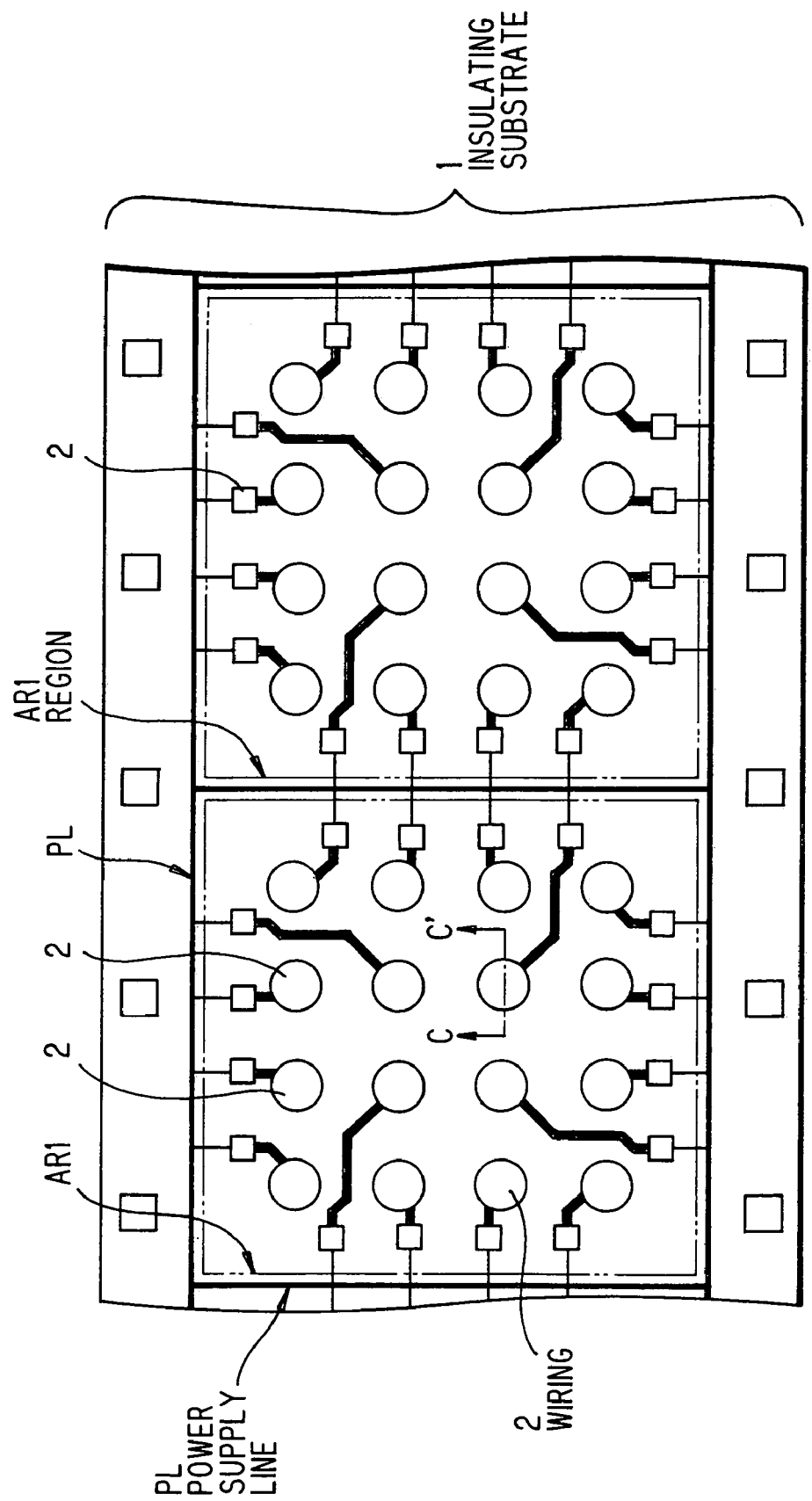
FIG. 14 is a plain view illustrating the method of making the wiring board used for the semiconductor device in the embodiment according to the invention.
Figure 15A:
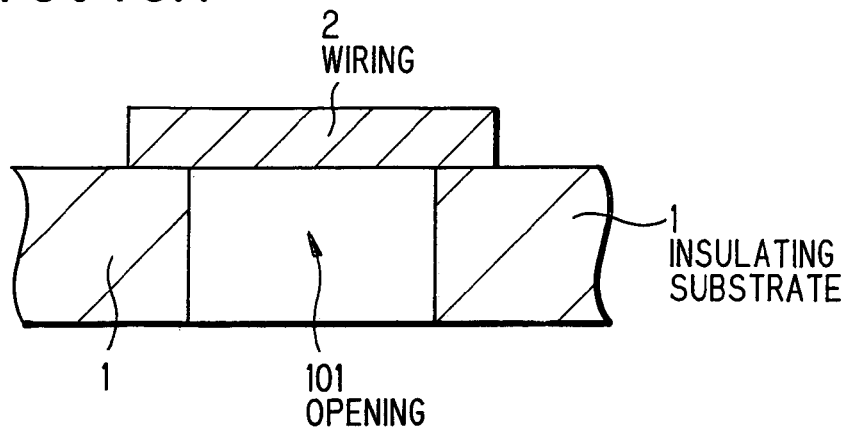
FIG. 15A is a cross sectional view cut along the line C–C' in FIG. 14.
Figure 15B:
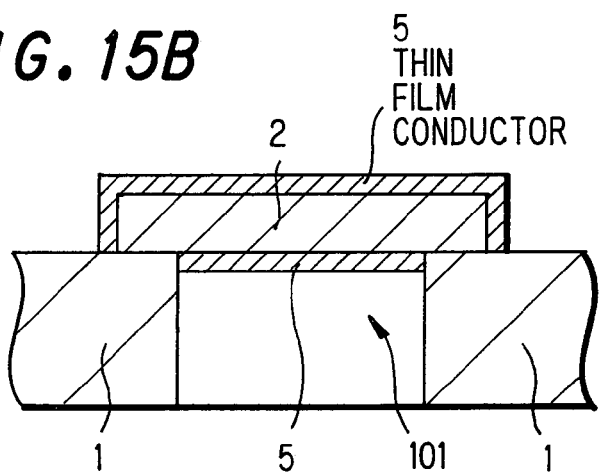
FIGS. 15B and 15C are cross sectional views illustrating the method of making the wiring board used for the semiconductor device in the embodiment according to the invention.
Figure 15C:
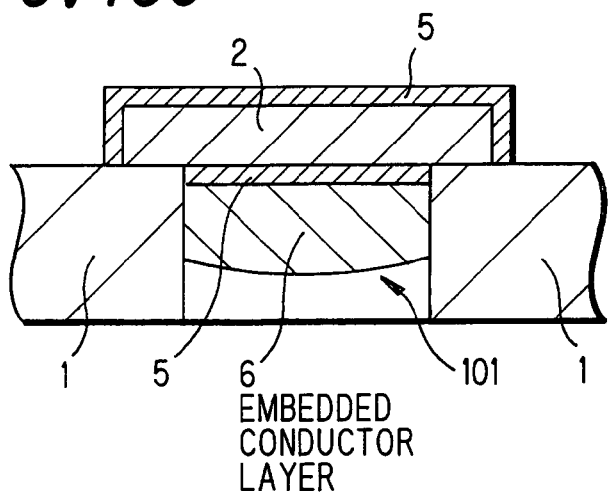

FIG. 12 is a plain view showing the step of forming openings 101 in the insulating substrate 1. FIG. 13 is a cross sectional view cut along the line B–B' in FIG. 12. FIG. 14 is a plain view showing the step of forming wirings 2. FIG. 15A is a cross sectional view cut along the line C–C' in FIG. 14. FIG. 15B is a cross sectional view showing the step of forming the thin film conductor 5 (gold plating). FIG. 15C is cross sectional view showing the step of forming the embedded conductor layer 6. FIGS. 15B and 15C show the cross section corresponding to that of FIG. 15A, i.e., C–C' cross section of FIG. 14.

In making the wiring board used for the semiconductor device of the embodiment, as shown in FIGS. 12 and 13, at first, the openings 101 are formed in the insulating substrate 1 and then conductor film 2' of copper foil is sticked. The openings 101 are formed by punching with a metal mold (punching mold). Before then, adhesive layer (not shown) is provided on the surface of the insulating substrate 1. After the openings 101 are formed, the conductor film 2' is sticked thereon.

The insulating substrate 1 is a tape-shaped substrate, which extends in the longitudinal direction as shown in FIG. 12 and is of e.g. polyimide. The openings 101 are continuously formed in region AR1, which is used as a wiring board, in the insulating substrate 1.

Alternatively, the openings 101 may be formed by another method. For example, after the conductor film 2' is sticked to the insulating substrate 1, the openings 101 may be formed by radiating laser light such as carbon dioxide laser.

Next, as shown in FIGS. 14 and 15A, unnecessary part of conductor film 2' is removed and then the wiring 2 (conductor pattern) is formed. The wiring 2 is formed by using the additive method or subtractive method. As shown in FIG. 14, for example, outside the region AR1 used as wiring board in the insulating substrate 1, power supply line PL for chemical gilding is formed. The wiring 2 is connected with the power supply line PL outside the region ARI to be short-circuited.

Then, as shown in FIG. 15B, thin film conductor 5 is formed on the exposed surface of wiring 2. The thin film conductor 5 is, for example, of gold plating with nickel plating base layer. Also, as shown in FIG. 15B, the thin film conductor 5 may be formed on the exposed surface of wiring 2 at the bottom of opening 101 in the insulating substrate 1.

Then, as shown in FIG. 15C, embedded conductor layer 6 is formed on the thin film conductor 5 at the bottom of opening 101 in the insulating substrate 1. For example, the embedded conductor layer 6 is formed by copper chemical gilding. The thickness of embedded conductor layer 5 is determined by a diameter and a depth of opening 101. For example, when the diameter and depth of opening 101 are 225 $\mu$m and 62 $\mu$m, respectively, the thickness of embedded conductor layer 6 is preferably about 30 $\mu$m.

Figure 1A:
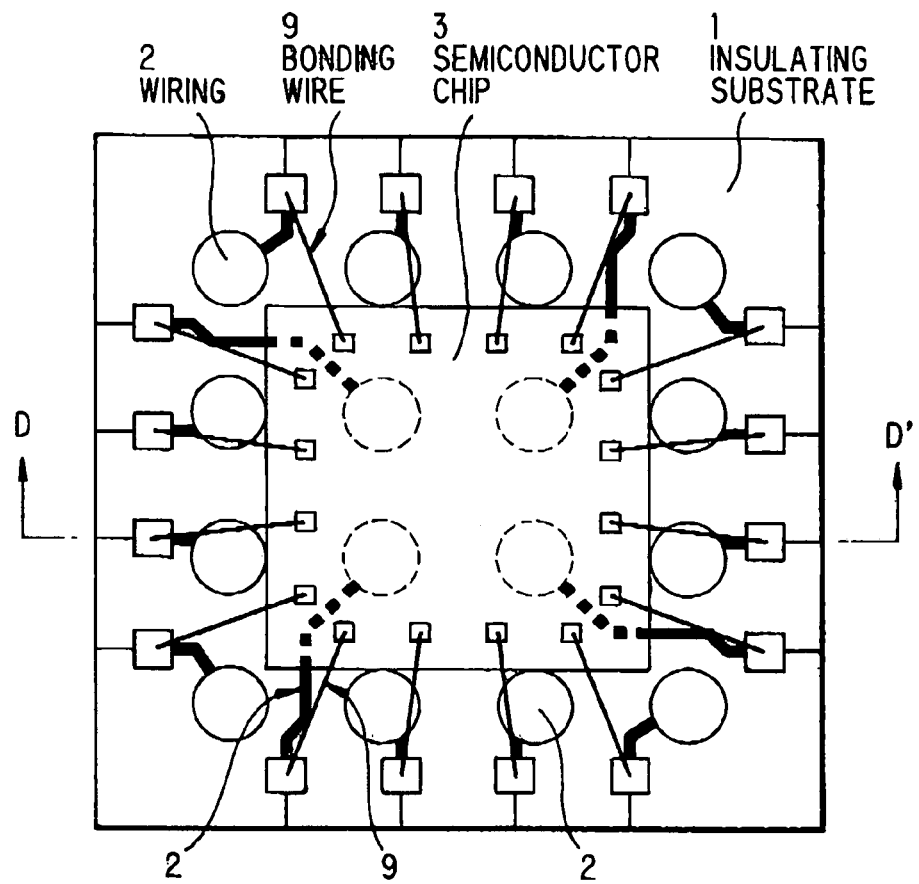
FIG. 1A is a plain view showing the conventional semiconductor device.
Figure 1B:
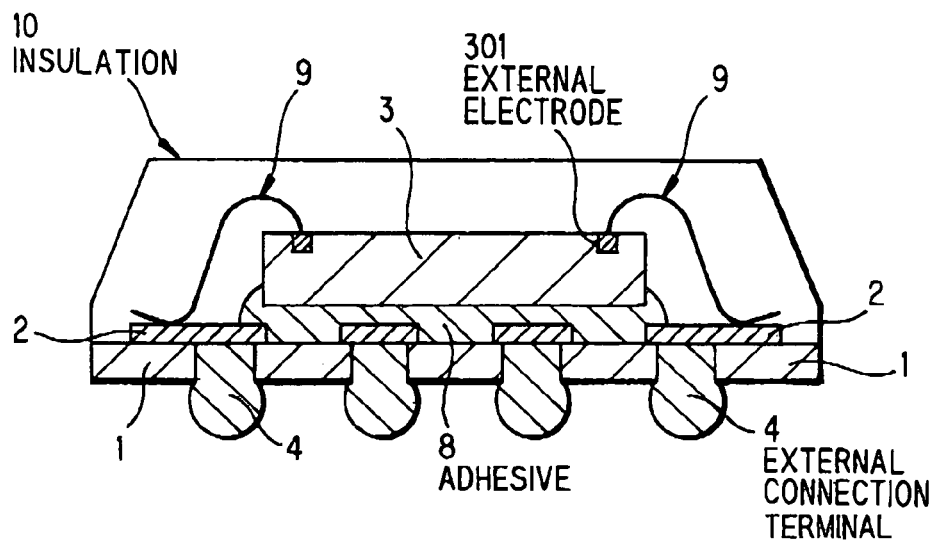
FIG. 1B is a cross sectional view cut along the line D-D' in FIG. 1A.
Figure 3A:
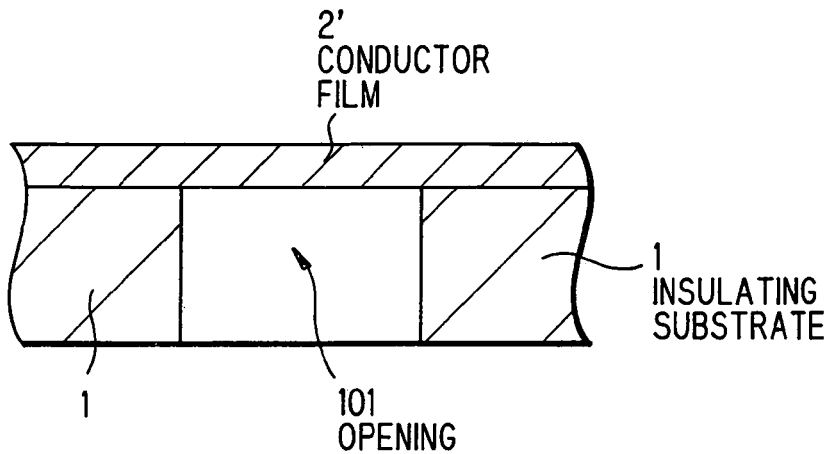
FIGS. 3A to 3C are cross sectional views illustrating the method of making a wiring board used for the conventional semiconductor device.
Figure 3B:
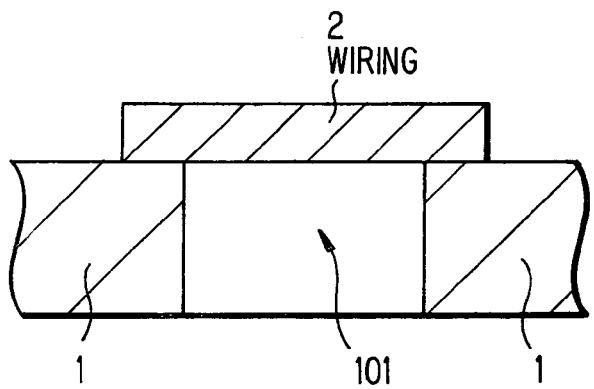
Figure 3C:
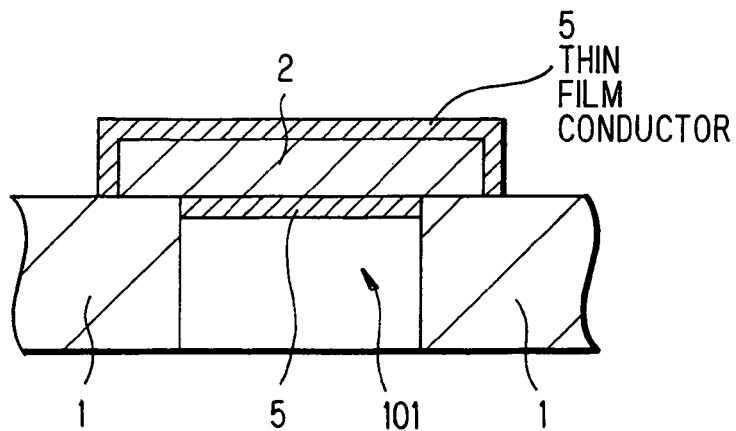
Figure 4:
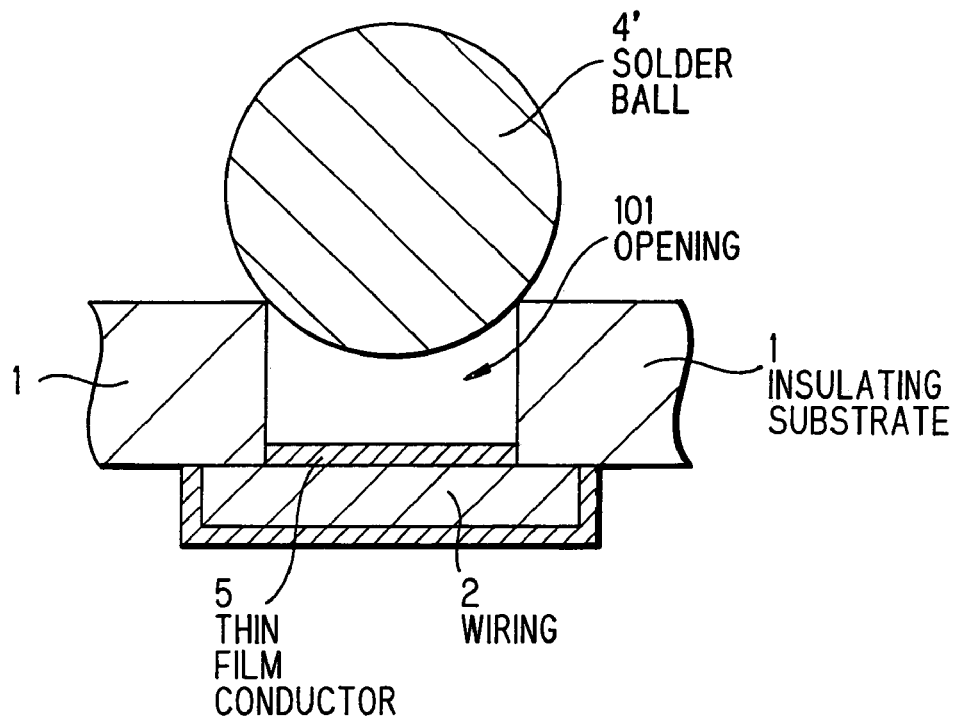
FIG. 4 is a cross sectional view illustrating the method of making the conventional semiconductor device.
Figure 5:
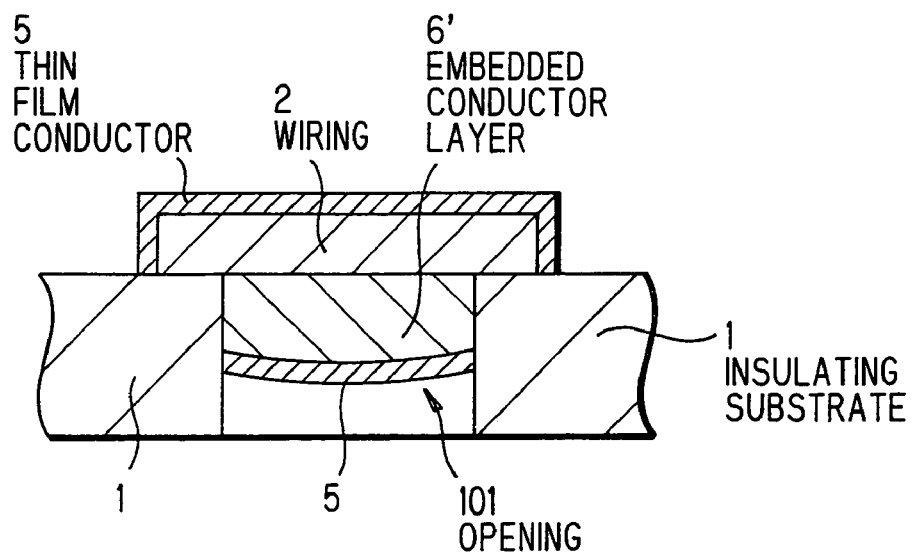
FIG. 5 is a cross sectional view showing another wiring board used for the conventional semiconductor device.
Figure 6A:
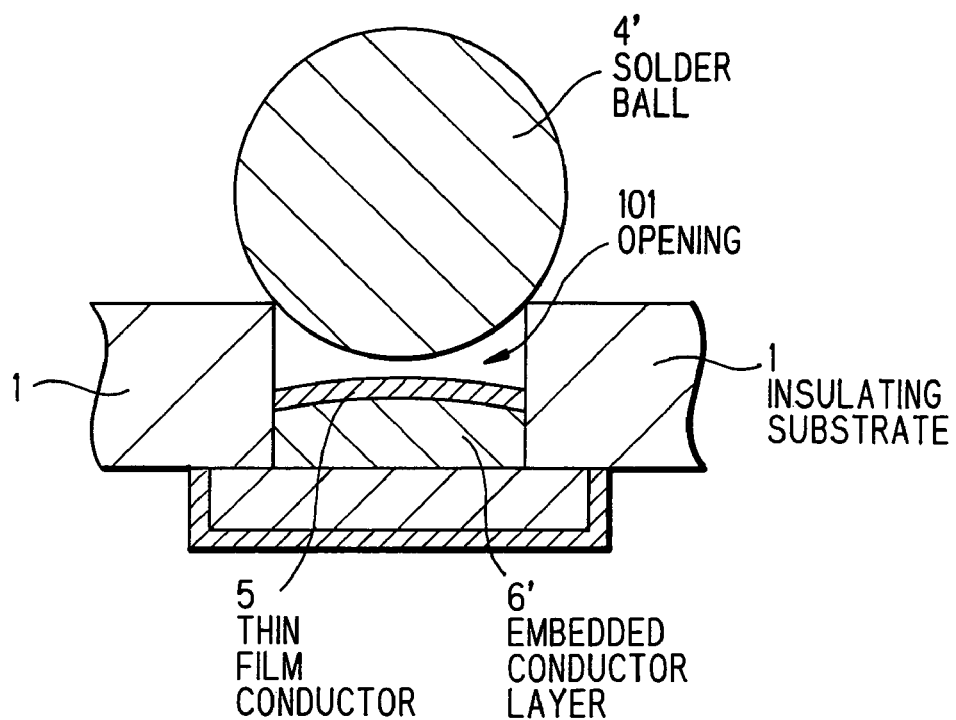
FIGS. 6A and 6B are cross sectional views illustrating the method of making the conventional semiconductor device.
Figure 6B:
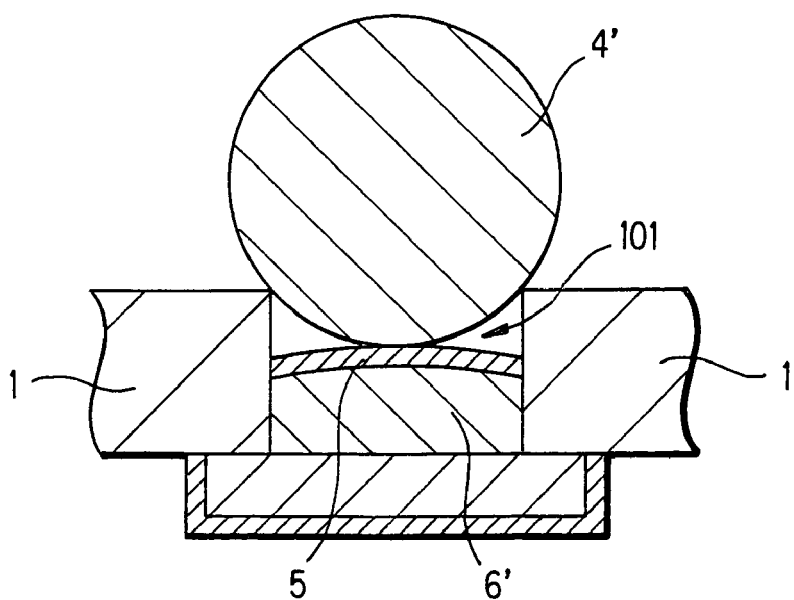
Figure 7A:
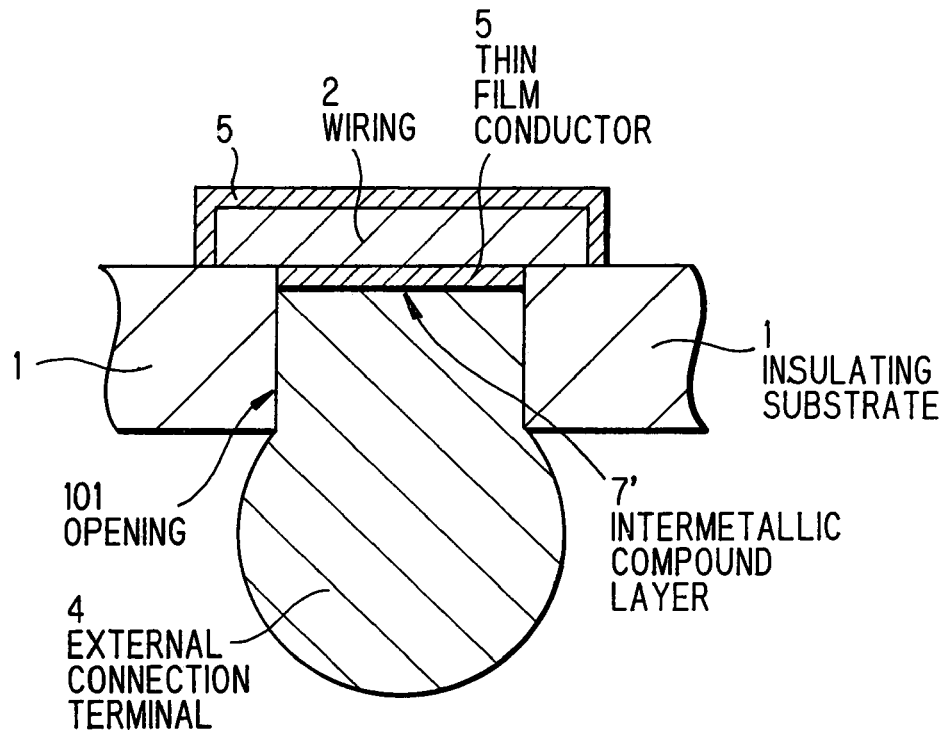
FIGS. 7A to 9B are cross sectional views illustrating the problems of the conventional semiconductor device.
Figure 7B:
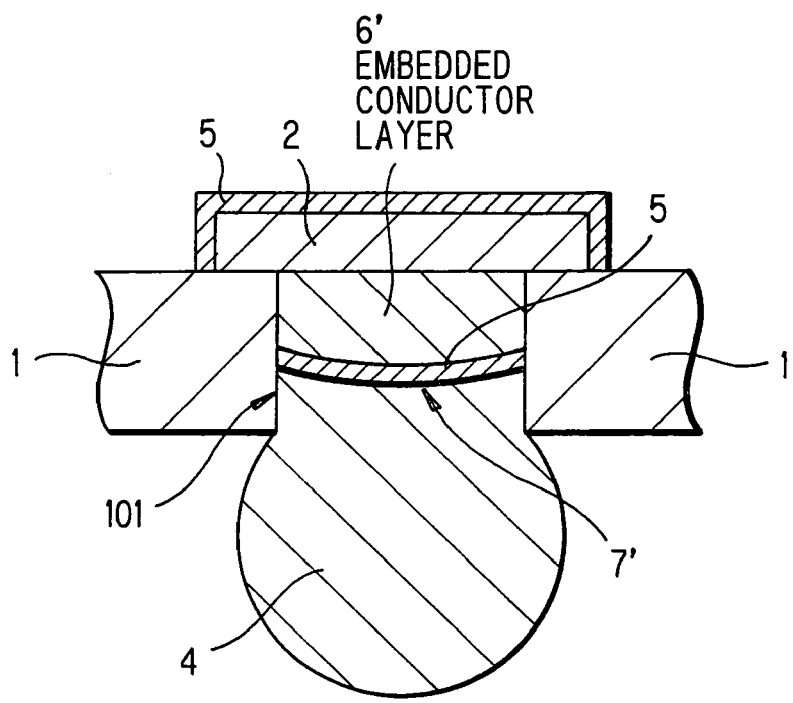
Figure 8A:
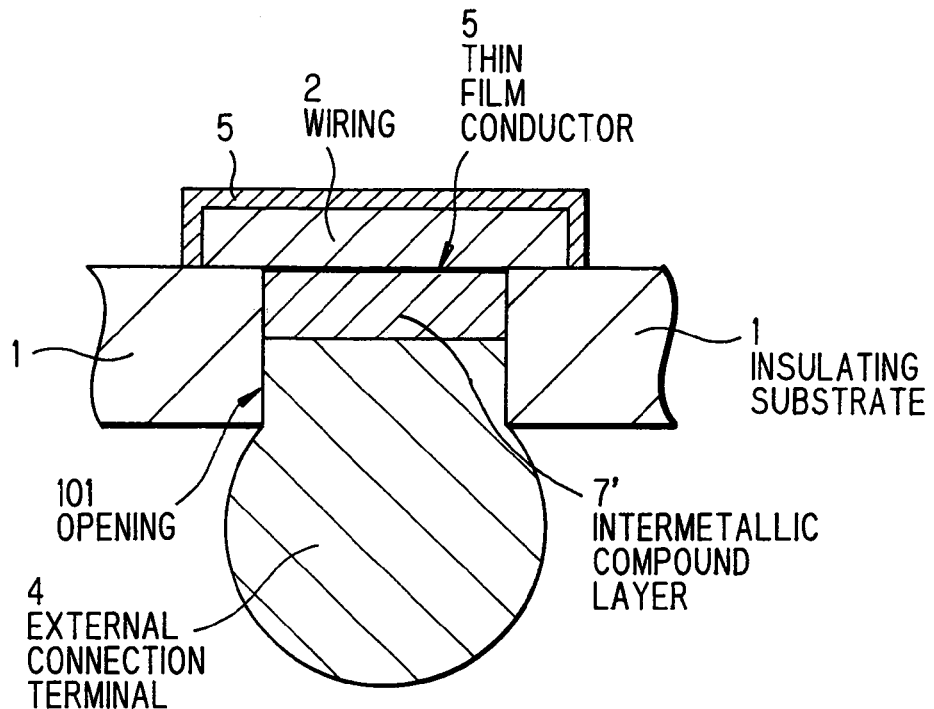
Figure 8B:
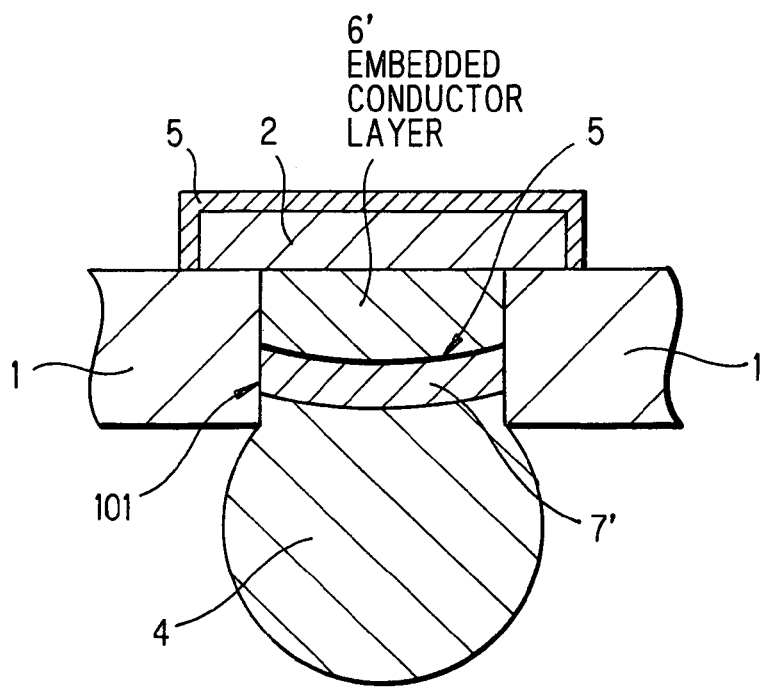
Figure 9A:
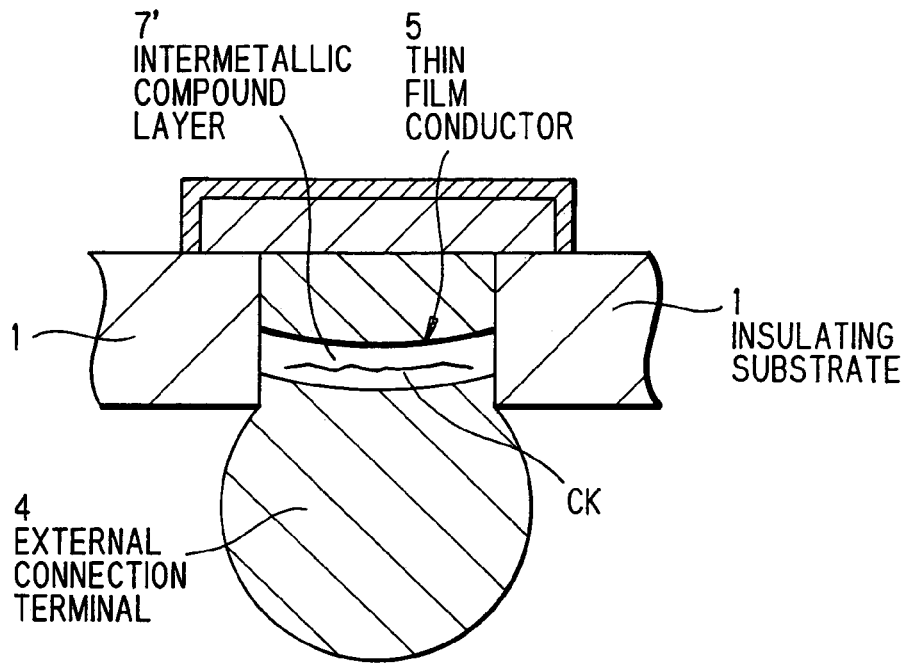
Figure 9B:
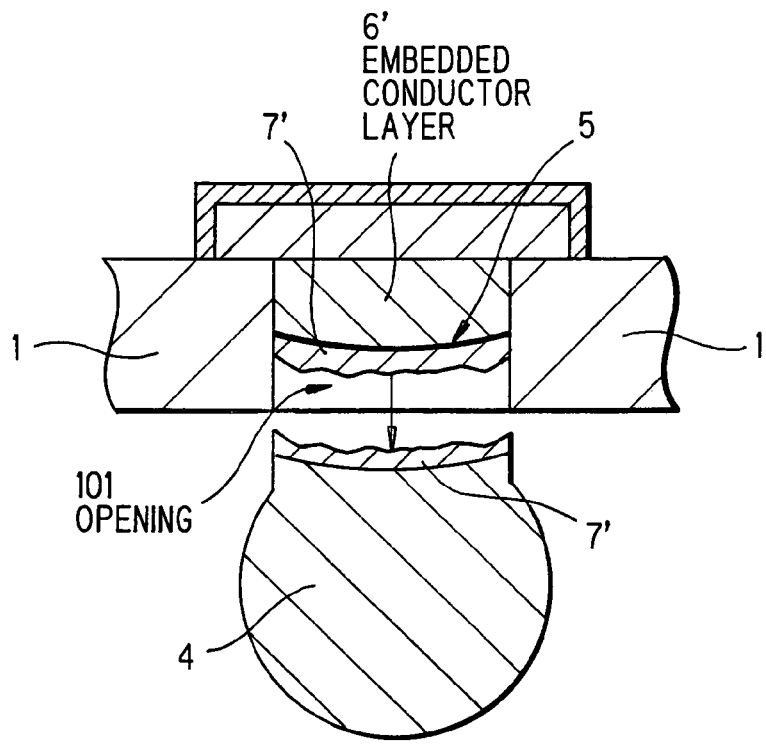

By conducting the above process, the wiring board used for the semiconductor device of the embodiment can be obtained. This process is differentiated from the conventional method of making the wiring board as shown in FIG. 5 only in that the step of embedding a conductor in the opening 101 is conducted after the step of forming the thin film conductor 5 (gold plating). Therefore, the wiring board used for the semiconductor device of the embodiment can be made using the same apparatus as the conventional wiring board.

Also, even if the thin film conductor 5 is formed on the lower surface of wiring 2 at the bottom of opening 101, embedded conductor layer 6 is thereafter formed on the thin film conductor 5 and, therefore, gold plating (thin film conductor 5) can be prevented from exposing at the bottom of opening 101. Thus, it is not necessary for the opening 101 to be masked with plating resist or masking tape as conducted in prior art. Accordingly, the manufacturing cost of wiring board can be reduced.

The method of making a semiconductor device in the embodiment will be explained referring to FIGS. 16A and 16B.

Figure 16A:
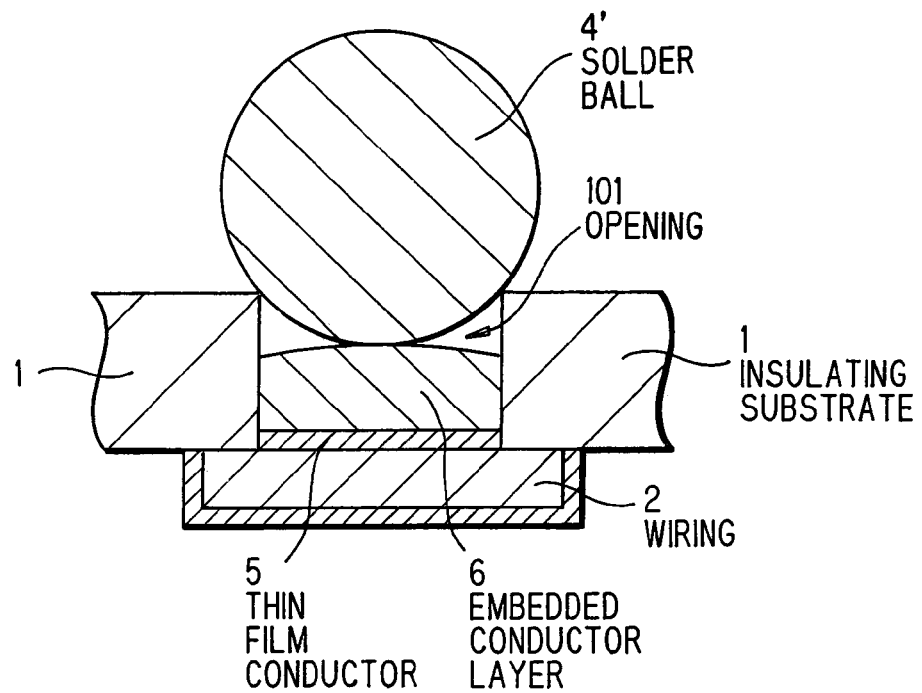
FIGS. 16A and 16B are cross sectional views illustrating the method of making the semiconductor device in the embodiment according to the invention.
Figure 16B:
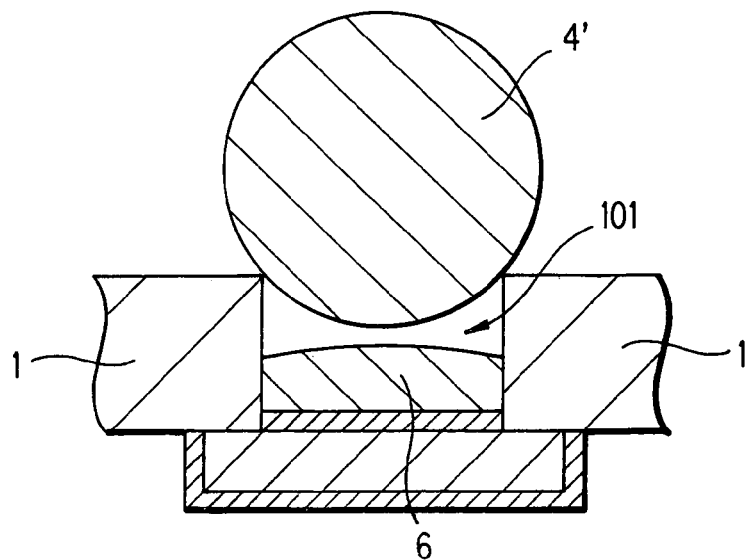

FIGS. 16A and 16B are cross sectional views showing the step of forming the external connection terminal 4.

In making the semiconductor device of the embodiment, first, as shown in FIG. 10B, the semiconductor chip 3 is sticked onto the wiring board by using e.g. adhesive 5. After the external electrode 301 on the semiconductor chip 3 is electrically connected through bonding wire 9 with the wiring 2 on the wiring board, the semiconductor chip 3 and the peripherals are sealed with insulation 10.

After that, as shown in FIG. 16A, solder ball 4' for forming the external connection terminal 4 is provided on the opening 101 in the insulating substrate 1 while turning the wiring board with the semiconductor chip 3 (not shown) mounted and insulation 10 (not shown) provided thereon. In this case, as shown in FIG. 16A, the solder ball 4' can be in contact with the embedded conductor layer 6 by controlling the thickness of embedded conductor layer 6. However, the solder ball 4' may be, as shown in FIG. 16B, not in contact with the embedded conductor layer 6 since the thickness of embedded conductor layer 6 is in fact dispersed.

Next, the solder ball 4' is melted by conducting h at treatment (reflowing) to the wiring board with the solder ball 4' mounted. The solder melted flows into the opening 101 and then, as shown in FIG. 11, intermetallic compound layer 7 is formed at the interface of melted solder and embedded conductor layer 6. Thereby, the external connection terminal 4 is joined to the embedded conductor layer 6.

The effect of embedded conductor layer 6 in the semiconductor device of the embodiment will be explained referring to FIGS. 17A and 17B.

Figure 17A:
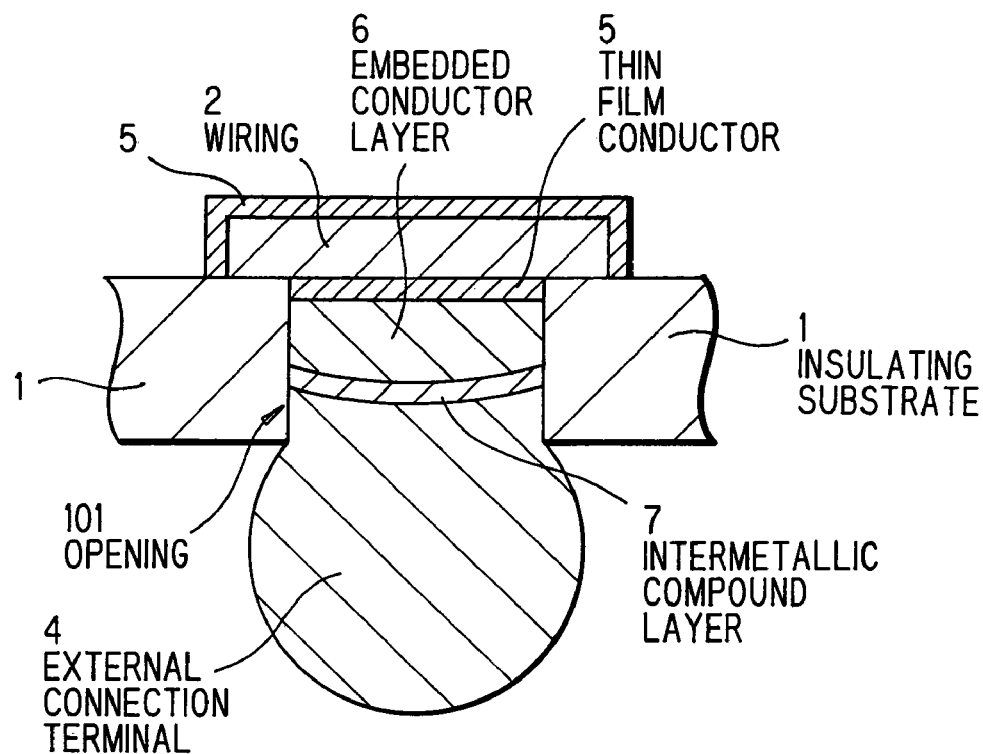
FIGS. 17A and 17B are cross sectional views illustrating the effect of the semiconductor device in the embodiment according to the invention.
Figure 17B:
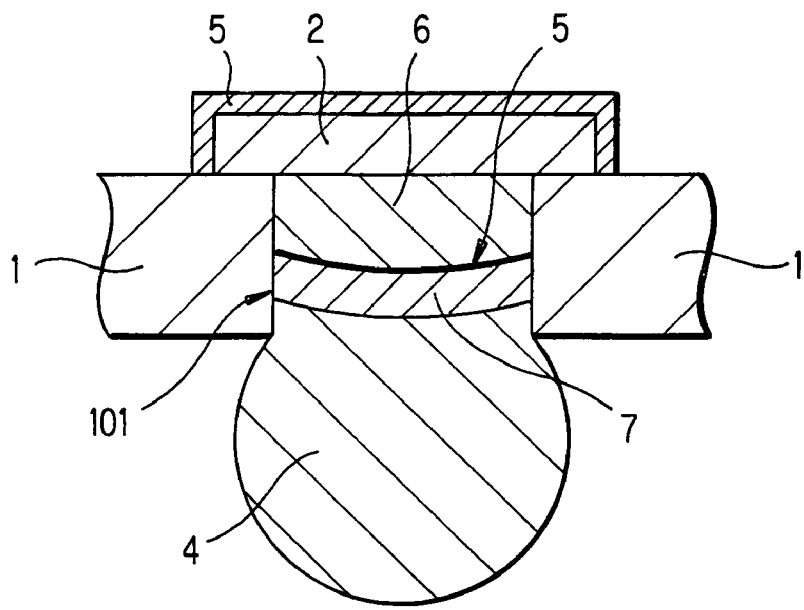

FIG. 17A is a cross sectional view showing the interface of embedded conductor layer 6 and external connection terminal 4 in the semiconductor device of the embodiment after a certain time elapsed, FIG. 17B is a cross sectional view showing the interface of embedded conductor layer 6 and external connection terminal 4 in the conventional semiconductor device after a certain time elapsed.

In the embodiment, just after the external connection terminal 4 was formed, the intermetallic compound layer 7 formed at the interface of external connection terminal 4 and embedded conductor layer 6 has a very thin thickness as shown in FIG. 11. However, when the semiconductor device is used as electronic parts (module) while being mounted on a mounting board, the intermetallic compound layer 7, as shown in FIG. 17A, grows and becomes thicker due to interdiffusion between external connection terminal 4 (tin-zinc alloy) and embedded conductor layer 6 (copper).

Copper has a rate of solution to tin-zinc alloy significantly lower than that of gold. Therefore, intermetallic compound layer 7 grown in the embodiment is thinner than intermetallic compound layer 7', which is made from gold and tin (or tin-zinc alloy) while being used under the same conditions as that of the embodiment, in the conventional semiconductor device as shown in FIG. 17B.

Thus, in the embodiment, cracks in the intermetallic compound layer 7 are less likely to occur due to thermal stress or external stress. Accordingly, the intermetallic compound layer 7 of the embodiment is less subject to breaking and therefore the external connection terminal 4 can be prevented from falling off the wiring board.

As explained above, in this embodiment, there is provided embedded conductor layer 6 between external connection terminal 4 (tin-zinc alloy) and thin film conductor 5 (gold plating). Thereby, the solution (diffusion) of gold to the external connection terminal 4 can be prevented. When embedded conductor layer 6 is formed by copper chemical gilding, the growth rate of intermetallic compound layer 7 generated at the interface of external connection terminal 4 and embedded conductor layer 6 is low since copper has a rate of solution to external connection terminal 4 (tin-zinc) significantly lower than that of gold. Therefore, the external connection terminal 4 can be prevented from falling off the wiring board due to the breaking of intermetallic compound layer 7.

Also, the aspect ratio of opening 101 can be reduced by forming the embedded conductor layer 6 in the opening 101. Thus, in making a semiconductor device by using the wiring board, a defective connection or shape can be avoided.

When the wiring board used for a semiconductor device in the embodiment is made using the steps described above, thin film conductor 5 can be prevented from being exposed at the bottom of opening 101 in the insulating substrate 1. Therefore, it is not necessary for the opening 101 to be masked using plating resist or masking tape and an increase in manufacturing cost of wiring board can be avoided.

Although in this embodiment the external connection terminal 4 is of tin-zinc alloy, it may be tin or tin alloy including other than zinc.

The embedded conductor layer 6 may be of another conductor that has a rate of solution lower than gold. For example, it may be nickel (Ni) or palladium (Pd). Above all, copper and nickel are conventionally used as conductor material for wiring board and can be easily applied to a conventional apparatus (plating apparatus) for making a wiring board. Also, when copper or nickel is used to form embedded conductor layer 6, it has a good connectivity with thin film conductor 5 (gold plating) and external connection terminal 4 (tin or tin alloy) and therefore external connection terminal 4 can be prevented from falling off.

Although in this embodiment, as shown in FIGS. 10A and 10B, the semiconductor chip 3 is face-up mounted and the wiring 2 of wiring board and the external electrode 301 of semiconductor chip 3 are connected through bonding wire 9, the semiconductor chip 3 may be flip-chip mounted.

Figure 18:
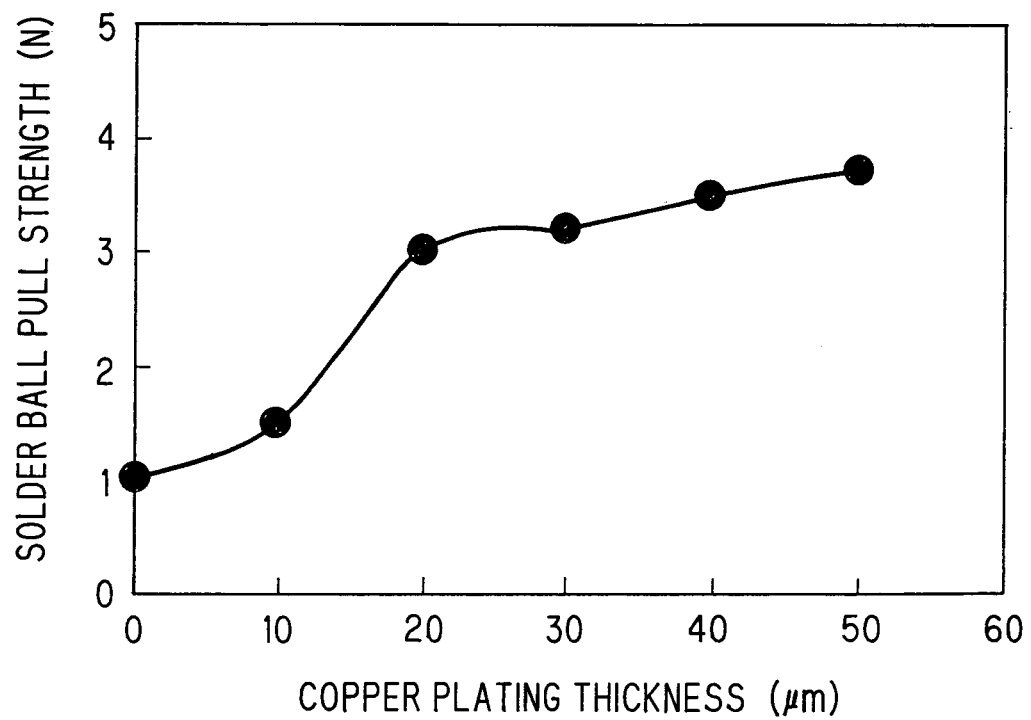
FIG. 18 is a graph showing the relationship between a thickness of embedded conductor layer 6 and a connection strength of external connection terminal 4 (solder ball) in the semiconductor device in the embodiment according to the invention.

FIG. 18 is a graph showing the relationship between a thickness of embedded conductor layer 6 and a connection strength of external connection terminal 4 (solder ball) in heat aging, where the diameter and depth of opening 101 (blind via hole) are 225 $\mu$m and 62 $\mu$m, respectively and the embedded conductor layer 6 is of copper plating. The graph gives a pull strength (N) of solder ball when a sample is subjected to heat aging at 150° C. for 1000 hours and then a pull test is conducted with a pull speed of 0.3 mm/sec at room temperature. Pull tester Series 4000P, DaGe Corp. is used to measure the pull strength.

As shown in FIG. 18, it is found that a solder ball pull strength is high even after long heat aging when a thickness of copper plating is 20 $\mu$m or more. Thus, it is preferable that embedded conductor layer 6 (copper plating) has a thickness of 20 $\mu$m or more for via hole with a pitch of 0.5 mm. It is estimated that this effect is caused by that the embedded conductor layer 6 functions as a barrier layer to prevent the diffusion of thin film conductor 5 (gold) to external connection terminal 4. Accordingly, the embedded conductor layer 6 can prevent fragile intermetallic compound layer from being formed by interdiffusion between gold in thin film conductor 5 and tin in external connection terminal 4 at the interface of embedded conductor layer 6 and external connection terminal 4. Therefore, the connectivity reliability of solder ball can be kept for a long period.

Nickel has a higher gold diffusion preventing effect than copper. Therefore, even when embedded conductor layer 6 of nickel has a thickness less than that of copper, it can give a sufficient gold diffusion preventing effect.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a wiring board that includes an insulating substrate and a wiring provided on the insulating substrate;
   a semiconductor chip that is mounted on said wiring board;
   an opening that is formed at a predetermined position in said insulating substrate, one end of said opening being shut by said wiring to form the bottom of said opening;
   a thin film conductor that is formed on the surface of said wiring and at the bottom of said opening;
   an embedded conductor layer that is provided in said opening while contacting said thin film conductor formed at the bottom of said opening; and
   an external connection terminal that is disposed at the other end of said opening to electrically connect with said wiring through said embedded conductor layer and said thin film conductor provided in said opening;
   wherein said embedded conductor layer is formed between said thin film conductor and said external connection terminal, said thin film conductor includes a gold plating layer formed on the surface, said external connection terminal is of tin or an alloy including tin, and said embedded conductor layer is of a conductor that has a rate of solution to tin or an alloy including tin lower than that of gold.

2. The semiconductor device according to claim 1, wherein:
   said embedded conductor layer is of copper or nickel.

3. The semiconductor device according to claim 1, wherein:
   said embedded conductor layer is of copper and has a thickness of 20 $\mu$m or more.

4. A wiring board comprising:
   an insulating substrate;
   a wiring provided on the insulating substrate;
   an opening that is formed at a predetermined position in said insulating substrate, one end of said opening being shut by said wiring to form the bottom of said opening;
   a thin film conductor that is formed on the surface of said wiring and at the bottom of said opening; and
   an embedded conductor layer that is provided in said opening while contacting said thin film conductor formed at the bottom of said opening;
   wherein said thin film conductor is formed between said wiring and said embedded conductor layer, said thin film conductor includes a gold plating layer formed on the surface, and said embedded conductor layer is of a conductor that has a rate of solution to tin or an alloy including tin lower than that of gold.

5. The wiring board according to claim 4, wherein:
   said embedded conductor layer is of copper or nickel.

6. The wiring board according to claim 4, wherein:
   said embedded conductor layer is of copper and has a thickness of 20 $\mu$m or more.

7. A method of making a wiring board, comprising the steps of:
   forming an opening at a predetermined position in an insulating substrate;
   forming a wiring pattern on the surface of said insulating substrate such that one end of said opening is shut by said wiring pattern to form the bottom of said opening;

forming a thin film conductor on the surface of said wiring pattern and at the bottom of said opening; and forming an embedded conductor layer in said opening and on the surface of said thin film conductor formed at the bottom of said opening;

wherein said thin film conductor includes a gold plating layer formed on the surface, and said embedded conductor layer is of a conductor that has a rate of solution to tin or an alloy including tin lower than that of gold.

8. The method of making a wiring board according to claim 7, wherein:

said embedded conductor layer is of copper or nickel.

9. The method of making a wiring board according to claim 7, wherein:

said embedded conductor layer is of copper and has a thickness of 20 $\mu$m or more.

* * * * *